US010133184B2

(12) United States Patent
Flagello

(10) Patent No.: US 10,133,184 B2
(45) Date of Patent: Nov. 20, 2018

(54) USING CUSTOMIZED LENS PUPIL OPTIMIZATION TO ENHANCE LITHOGRAPHIC IMAGING IN A SOURCE-MASK OPTIMIZATION SCHEME

(75) Inventor: Donis G. Flagello, Scottsdale, AZ (US)

(73) Assignee: NIKON CORPORATION, Tokyo (JP)

( * ) Notice: Subject to any disclaimer, the term of this patent is extended or adjusted under 35 U.S.C. 154(b) by 912 days.

(21) Appl. No.: 13/455,702

(22) Filed: Apr. 25, 2012

(65) Prior Publication Data
US 2013/0286369 A1 Oct. 31, 2013

(51) Int. Cl.
G03B 27/68 (2006.01)
G03F 7/20 (2006.01)

(52) U.S. Cl.
CPC ........ G03F 7/70125 (2013.01); G03F 7/705 (2013.01); G03F 7/70433 (2013.01)

(58) Field of Classification Search
CPC .... G03F 7/20; G03F 7/70125; G03F 7/70433; G03F 7/705
USPC ..................................... 355/52, 55
See application file for complete search history.

(56) References Cited

U.S. PATENT DOCUMENTS

| | | | | |
|---|---|---|---|---|
| 5,467,166 A | * | 11/1995 | Shiraishi | G03F 7/70125 355/53 |
| 5,610,684 A | * | 3/1997 | Shiraishi | G03F 7/70241 355/53 |
| 5,677,757 A | * | 10/1997 | Taniguchi | G03F 7/701 355/53 |
| 5,863,712 A | * | 1/1999 | Von Bunau | G03F 7/70125 355/53 |
| 5,929,991 A | | 7/1999 | McArthur et al. | |
| 6,118,516 A | * | 9/2000 | Irie | G03F 7/70125 355/53 |
| 6,304,317 B1 | * | 10/2001 | Taniguchi | G03F 7/701 355/53 |
| 6,310,679 B1 | * | 10/2001 | Shiraishi | 355/53 |
| 6,597,440 B1 | * | 7/2003 | Sasaki | G01J 9/00 356/121 |
| 6,795,163 B2 | | 9/2004 | Finders | |
| 6,833,906 B1 | * | 12/2004 | Ohsaki | G03F 7/706 355/53 |
| 6,963,390 B1 | | 11/2005 | Smith et al. | |
| 2005/0237512 A1 | | 10/2005 | Smith et al. | |
| 2005/0254024 A1 | * | 11/2005 | Marie Van Greevenbroek | G03F 7/70133 355/30 |
| 2005/0273753 A1 | | 12/2005 | Sezginer | |
| 2006/0244940 A1 | | 11/2006 | Uehara | |

(Continued)

FOREIGN PATENT DOCUMENTS

JP 2006005272 A * 1/2006
JP 2006245085 9/2006

OTHER PUBLICATIONS

"EETimes What is the source mask optimization" 02/09 pp. 1-3.
(Continued)

Primary Examiner — Deoram Persaud
(74) Attorney, Agent, or Firm — Yakov S. Sidorin; Quarles & Brady LLP

(57) ABSTRACT

A process for use in configuring a projection optics lithography system comprising providing a determination of pupil amplitude and phase optimization for the projection optics, for use in configuring the projection optics in accordance with the determination.

9 Claims, 2 Drawing Sheets

(56) References Cited

U.S. PATENT DOCUMENTS

| | | | |
|---|---|---|---|
| 2006/0290913 A1* | 12/2006 | Dieckmann | G03F 7/70308 355/53 |
| 2007/0188730 A1* | 8/2007 | Takeuchi | G03F 7/70566 355/71 |
| 2007/0296938 A1 | 12/2007 | Tel et al. | |
| 2008/0175432 A1* | 7/2008 | Choi | G03F 1/36 382/100 |
| 2008/0212183 A1 | 9/2008 | Uitterdijk et al. | |
| 2008/0309897 A1* | 12/2008 | Wong | G03F 1/144 355/44 |
| 2009/0091736 A1* | 4/2009 | Yamazoe | G03F 7/70091 355/77 |
| 2010/0119961 A1* | 5/2010 | Ye | G03F 1/144 430/30 |
| 2010/0141925 A1* | 6/2010 | Cao et al. | 355/77 |
| 2010/0251202 A1* | 9/2010 | Pierrat | G03F 1/36 716/50 |
| 2011/0032499 A1* | 2/2011 | Kawashima | G03B 27/42 355/53 |
| 2011/0173578 A1* | 7/2011 | Tsai | G03F 1/36 716/55 |
| 2011/0230999 A1* | 9/2011 | Chen | G03F 1/144 700/105 |
| 2014/0282298 A1* | 9/2014 | Fan | G06F 17/5081 716/53 |
| 2015/0131066 A1* | 5/2015 | Yamazoe | G03F 7/70616 355/53 |

OTHER PUBLICATIONS

Computational lithography: virtual reality and virtual virtuality (Computational lithography Lam 2009.pdf) pp. 1-10.

"Experimental Result and Simulation analysis for the use of Pixelated illumination from Source Mask Optimization for 22 nm Logic Lithography Process" Lai et al.

"Rigorous Vectorial Modeling for Polarized Illumination and Projection Pupil in OPC" Zhang et al., SPIE vol. 7028 2008; pp. 1-11.

"Lithographic Image Simulation for the 21st Century with 19-Century Tools" Gordon and Rosenbluth, SPIE vol. 5182 2003; pp. 73-87.

"Impact of across pupil transmittance variation in projection lenses on fine device pattern imaging" Sato et al., SPIE 5040 2003 ; pp. 33-44.

"Enhancement of photolithography resolution by fractional Fourier domain filtering" Microelectronic engineering 67-68 (2003) p. 31-38.

"Larger Depth of Focus for Increased Yield" Cathey and Johnson SPIE vol. 5754; pp. 1493-1499.

"Coherent Multiple Imaging by means of Pupil Plane Filtering" SPIE vol. 3679 1999; pp. 762-771.

"Practical approach to full-field wavefront aberration coeffients using phase wheel targets" Zavyalova, et al., SPIE vol. 6154-35; pp. 1-9.

"On the quality of measured optical aberration coefficients using phase wheel monitor" Zavyalova, et al., SPIE 6520 2007; pp. 1-9.

"Challenges and solutions in the calibration of projection lens pupil-image metrology tools" Slonaker et al., SPIE vol. 7274 2009; pp. 1-12.

Zavyalova et al., "Practical approach to full-field wavefront aberration measurement using phase wheel targets", Mar. 2006, pp. 1-9, vol. 6154, SPIE, USA.

W. Thomas Cathey and Gregory Johnson, "Larger depth of focus for increased yield", May 12, 2004, pp. 1493-1499, vol. 5754, SPIE, USA.

J. Du et al., "Enhancement of photolithography resolution by fractional Fourier domain filtering", (2003), pp. 31-38, vol. 67-68, Microelectronic Engineering, China.

Dylan McGrath, "What is source-mask optimization?", Feb. 27, 2009, pp. 1-3, EETimes.com, Santa Clara USA.

Miklos Erdelyi et al., "Choerent Multiple Imaging by means of Pupil Plane Filtering", Mar. 1999, pp. 762-771, vol. 3679, SPIE, Santa Clara USA.

Kafai Kai et al., "Experimental Result and Simulation Analysis for the use of Pixelated Illumination from Source Mask Optimization for 22nm Logic Lithography Process", 2009, pp. 72740A-1 through 72740A-12, vol. 7274, SPIE, USA.

Edmund Y. Lam and Alfred K. K. Wong, "Computation lithography: virtual reality and virtual virtuality", Jul. 20, 2009, pp. 12259-12268, vol. 17, No. 15, Optical Society of America, USA.

Lena V. Zavyalova et al., "On the quality of measured optical aberration coefficients using phase wheel monitor", 2007, pp. 1-9, vol. 6520, SPIE, USA.

Kazuya Sato et al., "Impact of across pupil transmittance variation in projection lenses on fine device pattern imaging", 2003, pp. 33-44, vol. 5040, SPIE, USA.

Steve Slonaker et al., "Challenges and solutions int he calibration of projection lens pupil-image metrology tools", 2009, pp. 1-10, vol. 7274, SPIE, USA.

Qiaolin (Charlie) Zhang et al., "Rigorous Vectorial Modeling for Polarized Illumination and Projection Pupil in OPC", 2008, pp. 1-11, vol. 7028, SPIE, USA.

Ronald L. Gordon and Alan E. Rosenbluth, "Lithographic Image Simulation for the 21st Century with 19th—Century Tools", 2003, pp. 73-87, vol. 5182, SPIE, Bellingham USA.

* cited by examiner

USING CUSTOMIZED LENS PUPIL OPTIMIZATION TO ENHANCE LITHOGRAPHIC IMAGING IN A SOURCE-MASK OPTIMIZATION SCHEME

INTRODUCTION AND BACKGROUND

This invention is designed to improve image quality of a projection optics lithography system (e.g. of the stepper and/or scanner type).

In a projection optics lithography system the image in photoresist is a function of the illumination source shape (or distribution), the object amplitude (the mask [or reticle] features), the lens attributes or pupil distribution, and the resist properties. The equation below states this in a more rigorous fashion $$\text{Scalar image } I(\hat{x}; z) = \int \tilde{J}(\hat{\alpha}_s) | FT^{-1} \{ \overbrace{F(\hat{\alpha}; z) \tilde{O}(\hat{\alpha} - \hat{\alpha}_s) \tilde{H}(\hat{\alpha})}^{\text{Coherent image}} \} |^2 d\hat{\alpha}_s$$

Illumination spectrum, Film Function, Mask spectrum, Pupil function

The "carrotted" variables in the above equation refer to sets of coordinate. Hence $\hat{x}=(x,y)$ and z are the image space coordinates; $\hat{\alpha}=(\alpha,\beta)$ and $\hat{\alpha}_s$ are the pupil space coordinates. In the current use of source-mask optimization (SMO), the image, I, is the desired target. The source shape, J, and the Fourier transform of the Mask Spectrum are variables that are optimized. The Pupil and the Film (resist) are assumed fixed. SMO typically seeks to solve the inverse of this equation.

SUMMARY OF THE PRESENT INVENTION

The present invention is designed to improve optical lithography image quality, by providing a determination of pupil amplitude and phase optimization, which can then be used in providing optimization at the pupil plane (e.g. by configuration of the projection optics, including providing pupil plane filter(s)). Thus, the present invention is designed to enable additional degrees of freedom to optimize the image quality produced by the optical lithography system. In essence, the present invention focuses on the pupil of the projection optics, as opposed to the illumination source and/or reticle, which are more traditionally the focus of a source mask optimization.

In a preferred embodiment, the present invention adds to a source mask optimization process (as a computational process) an additional computational feature that provides for determining pupil amplitude and phase optimization, thereby enabling optimization at the pupil plane (e.g. by configuration of the projection optics).

For example, the present invention can produce (determine) the metrics (amplitude and phase parameters) by which a customized pupil plane filtering (e.g. by one or more transmission filters) can be produced for a specific mask pattern.

One way the present invention is intended to depart from prior source mask optimization concepts is that it seeks to enhance the imaging properties of a scanner/stepper system by using the amplitude and phase distributions within the pupil of the projection optic. It is believed that the pupil has not been previously used in any source/mask optimization schemes. Using the pupil distribution as a free parameter gives many more degrees of freedom to optimize the lithographic image.

The principles of the present invention can be practiced with source mask optimization that also optimizes illumination and/or reticle parameters, or it can be practiced assuming the illumination and/or reticle parameters are fixed. Also, the invention can be practiced in a manner that adds a customized lens pupil function to the computation that is intended to result in the creation of a custom lens pupil plane filter with amplitude and phase parameters that have been calculated for a specific mask pattern.

Further features of the present invention will be apparent from the following detailed description and the accompanying drawing

DETAILED DESCRIPTION

As described above, the present invention relates to a method of improving optical image quality in a projection optics lithography system, e.g. of the stepper and/or scanner type, both of which are well known to those in the optical lithography art.

Figure 1:
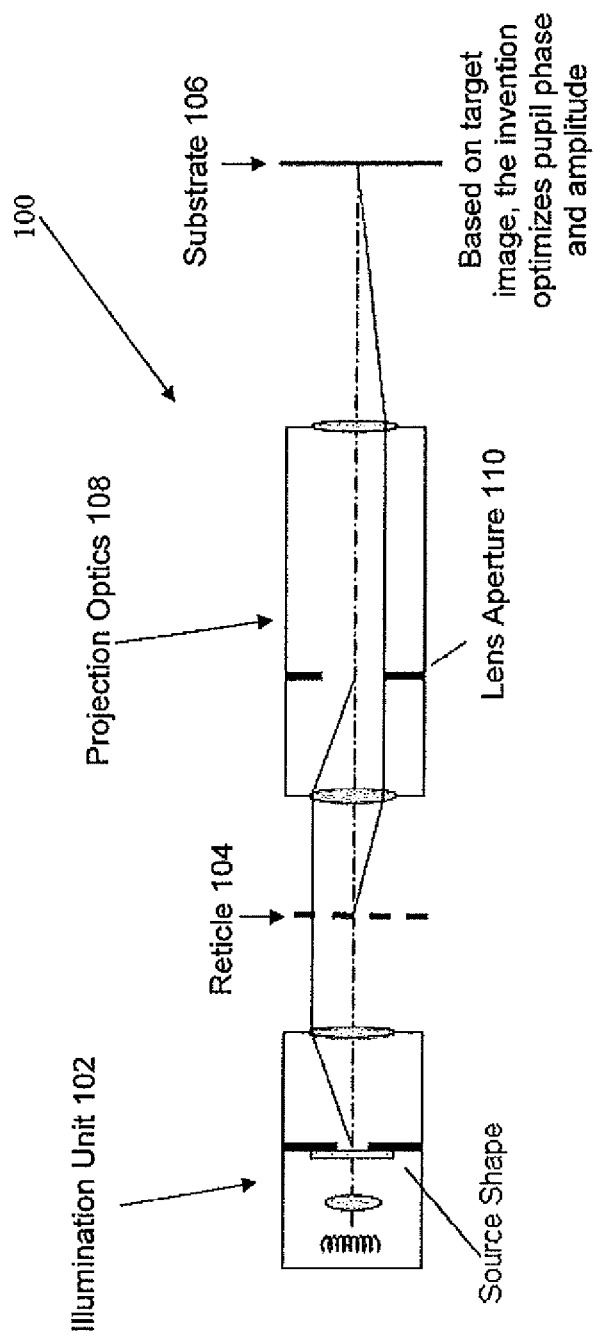
FIG. 1 is a schematic illustration of the optical lithography system and method components with which the principles of the present invention can be practiced.

As illustrated in FIG. 1, the basic components a projection optics lithography system 100 comprise an illumination source unit 102 where the shape, and distribution of an illumination source are determined, and the illumination source unit 102 is oriented to illuminate a reticle 104 (also known as a mask) that provides the image pattern to be projected to a substrate 106 (e.g. a semi conductor wafer substrate). The image of the reticle 104 is projected to the substrate 106 by a projection optics system 108 that includes a lens aperture or lens pupil 110, at the pupil plane of the projection optics 108. The projection optics 108 can include e.g. lens, mirrors and other optics, as is well known to those in the art. The image that is projected to the substrate 106 produces an image in photoresist that is applied to the substrate. That image then forms part of an electrical circuit that is produced in the substrate in the production of a semi conductor wafer.

In a projection optics lithography system the image in photoresist is a function of the illumination source shape (or distribution), the object amplitude (the mask features), the lens attributes or pupil distribution, and the resist properties. The equation below states this in a more rigorous fashion $$\text{Scalar image } I(\hat{x}; z) = \int \tilde{J}(\hat{\alpha}_s) | FT^{-1} \{ \overbrace{F(\hat{\alpha}; z) \tilde{O}(\hat{\alpha} - \hat{\alpha}_s) \tilde{H}(\hat{\alpha})}^{\text{Coherent image}} \} |^2 d\hat{\alpha}_s$$

Illumination spectrum, Film Function, Mask spectrum, Pupil function

The "carrotted" variables in the above equation refer to sets of coordinate. Hence x̂=(x,y) and z are the image space coordinates; α̂=(α,β) and α̂$_s$ are the pupil space coordinates. In the current use of source-mask optimization (SMO), the image, I, is the desired target. The source shape, J, and the Fourier transform of the Mask Spectrum are variables that are optimized. The Pupil and the Film (resist) are assumed fixed. SMO typically seeks to solve the inverse of this equation.

The present invention is designed to improve optical lithography image quality, by providing determining pupil amplitude and phase optimization, which can then be used in providing optimization at the pupil plane (e.g. by configuration of the projection optics, including providing pupil plane filter(s)). Thus, the present invention is designed to enable additional degrees of freedom to optimize the image quality produced by the optical lithography system. In essence, the present invention focuses on the pupil of the projection optics, as opposed to the illumination source and/or reticle, which are more traditionally the focus of a source mask optimization.

Figure 2:
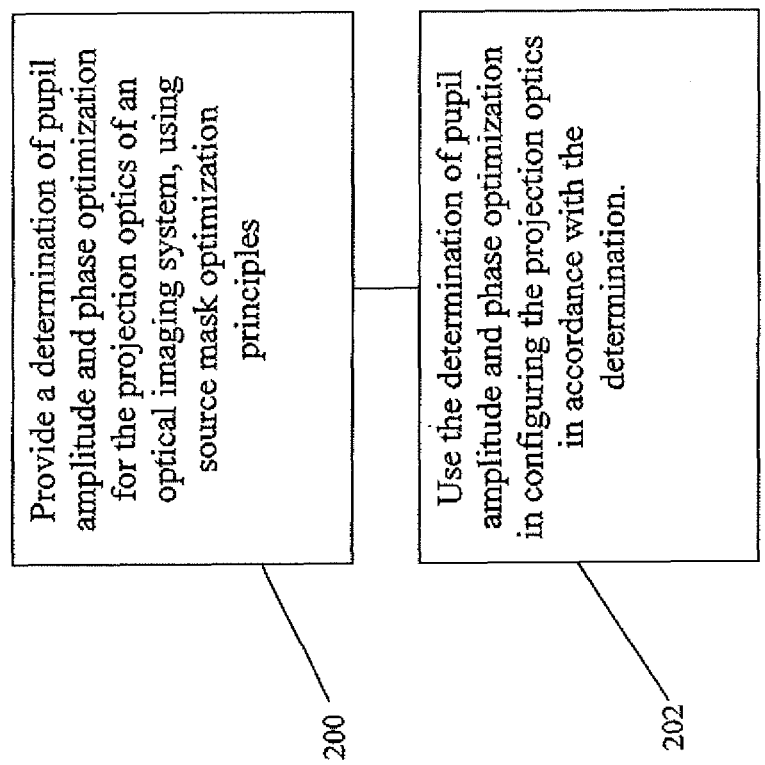
FIG. 2 is a schematic illustration of a method for use in configuring a projection optics lithography system, according to the invention.

The basic process for configuring the projection optics, according to the present invention is schematically shown in FIG. 2. Initially, as shown by step 200, a determination of pupil amplitude and phase optimization is provided for the projection optics (e.g. in FIG. 1 the projection optics 108), using source mask optimization principles. Then, as shown by step 202, the determination of pupil amplitude and phase optimization is used in configuring the projection optics in accordance with the determination.

The invention also may be practiced using source-mask optimization. Hence, it can be thought of doing a source-mask-lens optimization. Moreover, the determination of pupil amplitude and phase optimization can be provided as part of a source mask optimization process, which can also provide optimization of either or both of the source or the mask of the projection optics system. The determination of pupil amplitude and phase optimization is produced with (a) either or both of the source shape and Fourier transform of the mask spectrum assumed fixed, or (b) either or both of the source shape and/or the Fourier transform of the mask spectrum treated as variables that are determined as part of the optimization process.

In implementing the source mask optimization represented by the formula above, the present invention allows the pupil phase and amplitude to be optimized, by having the pupil as the variable in the formula above. Based on the target (i.e. Scalar) Image, the formula above is used to optimize pupil phase and amplitude. This can result in solutions where the amplitude transmission and the phase of the pupil are variable. Essentially, if the pupil distribution is defined as:

$$\tilde{H}(\alpha,\beta)=A(\alpha,\beta)e^{-i\phi(\alpha,\beta)},$$

this invention allows constrained and unconstrained solutions of A and φ.

Thus, the present invention adds to a source mask optimization process (as a computational process) an additional computational feature that provides for determining pupil amplitude and phase optimization, thereby enabling optimization at the pupil plane (e.g. by configuration of the projection optics, including providing pupil filter(s)). One way the present invention is intended to depart from prior source mask optimization concepts is that it seeks to enhance the imaging properties of a scanner/stepper system by using the custom amplitude and phase distributions within the pupil of the projection optic. It is believed that the pupil has not been previously used in any source/mask optimization schemes. Using the pupil distribution as a free parameter gives many more degrees of freedom to optimize the lithographic image.

The principles of the present invention can be practiced with source mask optimization that also optimizes illumination and/or reticle parameters, or it can be practiced assuming the illumination and/or reticle parameters are fixed. Also the invention can be practiced in a manner that adds a customized lens pupil function to the computation that is intended to result in the creation of a custom lens pupil plane filter with amplitude and phase parameters that have been calculated for a specific mask pattern.

The distribution is optimized for the lithographic image in photoresist, and may allow for a custom amplitude, custom phase, and/or custom intensity distribution in the pupil of the projection optics ("PO"). For example, the present invention can produce (determine) the metrics (amplitude and phase parameters) by which customized pupil plane filtering (e.g. by one or more transmission filters) can be produced for a specific mask pattern.

Current scanners and steppers have huge flexibility in varying the phase of the pupil by manipulation of the Zernike aberrations; however, these are usually used to minimize Zernikes or match to other systems. The present invention would allow for the variation of those Zernikes with a simultaneous variation of the source and/or mask features to achieve the target image. This has the advantage of introducing more degrees of freedom to solve the inverse image equation. In addition, we seek to introduce customize amplitude transmission variation by the use of transmission filters at the pupil.

Finally, the optimization of the pupil distribution also can include changes to the Jones pupil of the PO when polarization illumination is used. In this case, the input polarization distribution in the lens pupil can be allowed to "float" in conjunction with the Jones pupils. The vector equation below shows the equation to be inverted:

$$\text{Vector image}\begin{bmatrix}I_x\\I_y\\I_z\end{bmatrix}=\int \tilde{J}(\hat{\alpha}_s)|FT^{-1}\{F(\hat{\alpha};z)\boldsymbol{P}(\hat{\alpha})\tilde{\boldsymbol{H}}(\hat{\alpha})\tilde{\boldsymbol{O}}(\hat{\alpha}-\hat{\alpha}_s)\}|^2 d\hat{\alpha}_s$$

↑
Polarization
Amplitudes where the function within the curly brackets are now all matrices and the polarization amplitudes per pupil point, P, have been introduced. The input polarization is defined by the object matrix, and can be unique for each pupil point. The pupil function H, is now in terms of a Jones pupil, so it can have solutions for multiple polarization basis functions.

Accordingly, the present invention is designed to enhance the imaging properties of a scanner/stepper system by using the amplitude and phase distributions within the pupil of the projection optic. Using the pupil distribution as a free parameter gives many more degrees of freedom to optimize the lithographic image. In addition, it allows for customized pupil filters to help enhance imaging in the scanner/stepper, particularly for low k1 imaging, i.e., k1<0.3.

The invention claimed is:

1. A method for imaging a pattern of a mask with a projection optical system of an exposure apparatus that is configured to illuminate the pattern of the mask with an illumination optical system of the exposure apparatus, wherein the illumination optical system is characterized by an illumination condition and the projection optical system is characterized by an imaging condition, the method comprising:
defining a model of the projection optical system, said model being configured to generate parameters of a first image of said pattern when data, representing the pattern, are entered into the model, wherein the first image is a target image of the pattern;
entering the illumination condition and the imaging condition into the model, wherein the imaging condition includes (i) a first pupil transmittance distribution at a pupil of the projection optical system, and (ii) a first phase distribution at said pupil;
after said entering, inputting the data representing the pattern into the model;
computing, with the use of a computer, characteristics of a second image of the pattern based on said entering and said inputting;
with the use of the computer, comparing the first and second images of the pattern to determine a second pupil transmittance distribution at said pupil and a second phase distribution at said pupil, wherein the second pupil transmittance distribution and the second phase distribution are defined to achieve a formation of the target image when the imaging condition is modified from (a) including the first pupil transmittance distribution and the first phase distribution to (b) including the second pupil transmittance distribution and the second phase distribution;
and
transforming the exposure apparatus to form a transformed projection optical system that includes a transmission filter, possessing the second pupil transmittance and the second phase distribution, at said pupil, and
forming an optical image of said pattern with the transformed projection optical system.

2. The method of claim 1, wherein the imaging condition includes a polarization characteristic of the projection optical system.

3. The method of claim 1, wherein the illumination condition includes a light intensity distribution across a pupil of the illumination optical system.

4. The method of claim 1, wherein the model of the projection optical system is represented by:

$$I(\hat{x};z) = \int \tilde{J}(\hat{\alpha}_s) FT^{-1} |\{F(\hat{\alpha};z)\} P(\hat{\alpha}) \tilde{H}(\hat{\alpha}) \tilde{O}(\hat{\alpha}-\hat{\alpha}_s)\}|^2 d\hat{\alpha}_s$$

wherein $\hat{x}=(x, y)$ and $z$ are coordinates in an image space; $\hat{\alpha}=(\alpha, \beta)$ and $\hat{\alpha}_s$ are coordinates in a pupil space; $I(\hat{x}; z)$ is a target image matrix representing a target image at a photoresist in an image plane formed by the system; $\tilde{J}(\hat{\alpha}_s)$ is a spatial spectrum of an illumination source used to form the target image; $F(\hat{\alpha}; z)$ is a photoresist matrix representing a spatial spectrum of the photoresist; $P(\hat{\alpha})$ is a polarization matrix representing polarization of light across the pupil plane; $\tilde{O}(\hat{\alpha}-\hat{\alpha}_s)$ is a reticle matrix representing a spatial spectrum of a reticle of the system, and $\tilde{H}(\hat{\alpha})$ is a pupil function matrix representing a pupil function, and wherein the pupil function matrix is used as a free parameter.

5. The method of claim 1, further comprising
with the use of the computer, solving a reverse problem to compute the second pupil transmittance distribution and the second phase distribution.

6. The method of claim 1, wherein the model of the projection optical system is expressed by an equation $$I(\hat{x};z) = \int \tilde{J}(\hat{\alpha}_s) FT^{-1} |\{F(\hat{\alpha};z)\} P(\hat{\alpha}) \tilde{H}(\hat{\alpha}) \tilde{O}(\hat{\alpha}-\hat{\alpha}_s)\}|^2 d\hat{\alpha}_s$$

wherein $\hat{x}=(x, y)$ and $z$ are coordinates in an image space; $\hat{\alpha}=(\alpha, \beta)$ and $\hat{\alpha}_s$ are coordinates in a pupil space; $I(\hat{x}; z)$ is a target image matrix representing a target image at a photoresist in an image plane formed by the system; $\tilde{J}(\hat{\alpha}_s)$ is a spatial spectrum of an illumination source used to form the target image; $F(\hat{\alpha}; z)$ is a photoresist matrix representing a spatial spectrum of the photoresist; $P(\hat{\alpha})$ is a polarization matrix representing polarization of light across the pupil plane; $\tilde{O}(\hat{\alpha}-\hat{\alpha}_s)$ is a reticle matrix representing a spatial spectrum of a reticle of the system, and $\tilde{H}(\hat{\alpha})$ is a pupil function matrix representing a pupil function, and wherein the pupil function matrix is used as a free parameter,
and further comprising
with the use of a computer, solving a reverse problem to compute the second pupil transmittance distribution and the second phase distribution to determine parameters of said transmission filter.

7. The method of claim 1 further comprising:
producing said transmission filter characterized by the second pupil transmittance distribution; and
integrating said transmission filter into the projection optical system.

8. The method of claim 1, further comprising:
illuminating the pattern of the mask with light that has traversed the illumination optical system.

9. A method for manufacturing a device by imaging a pattern of a mask with a projection optical system of an exposure apparatus, wherein the exposure apparatus is configured to illuminate the pattern of the mask with an illumination optical system of the exposure apparatus, wherein the illumination optical system is characterized by an illumination condition and the projection optical system is characterized by an imaging condition, the method comprising:
defining a model of the projection optical system, said model being configured to generate parameters of a first image of a pattern of a mask in the exposure apparatus when data, representing the pattern, are entered into the model, wherein the first image is a target image of the pattern;
entering the illumination condition and the imaging condition into the model, wherein the imaging condition includes (i) a first pupil transmittance distribution at a pupil of the projection optical system, and (ii) a first phase distribution at said pupil;
after said entering, inputting the data representing the pattern into the model;
computing, with the use of a computer, characteristics of a second image of the pattern based on said entering and said inputting;
with the use of the computer, comparing the first and second images of the pattern to determine a second pupil transmittance distribution at said pupil and a second phase distribution at said pupil, wherein the second pupil transmittance distribution and the second phase distribution are defined to achieve a formation of the target image when the imaging condition is modified from (a) including the first pupil transmittance distribution and the first phase distribution to (b) including the second pupil transmittance distribution and the second phase distribution;

transforming the exposure apparatus to form a transformed projection optical system that includes a transmission filter, possessing the second pupil transmittance and the second phase distribution, at said pupil;

exposing a photosensitive substrate with light transmitted through the illumination system and the transformed projection optical system by forming an optical image of said pattern at a surface of the photosensitive substrate;

developing the photosensitive substrate;

forming a mask layer dimensioned to correspond to the optical image of said pattern formed at the surface of the photosensitive substrate; and processing the surface of the photosensitive substrate via the mask layer.

\* \* \* \* \*